(12) United States Patent
Weiss

(10) Patent No.: US 7,177,607 B2
(45) Date of Patent: Feb. 13, 2007

(54) CONTROLLING TRANSMISSION MODE ON BASIS OF POWER IN PRECEDING TIME SLOT

(75) Inventor: Manfred Weiss, Rot-Haslach (DE)

(73) Assignee: Nokia Corporation, Espoo (FI)

( * ) Notice: Subject to any disclaimer, the term of this patent is extended or adjusted under 35 U.S.C. 154(b) by 280 days.

(21) Appl. No.: 10/936,511

(22) Filed: Sep. 9, 2004

(65) Prior Publication Data

US 2005/0266809 A1    Dec. 1, 2005

(30) Foreign Application Priority Data

Jun. 1, 2004    (GB)    ................................. 0412188.5

(51) Int. Cl.
*H04B 1/02*    (2006.01)
*H01Q 11/12*    (2006.01)

(52) U.S. Cl. .............................. 455/127.1; 455/127.2; 455/102

(58) Field of Classification Search ............. 455/127.1, 455/127.2, 522, 127.5, 91, 117, 102, 572, 455/343.1; 332/119, 145, 151; 375/295, 375/297; 330/129, 133
See application file for complete search history.

(56) References Cited

U.S. PATENT DOCUMENTS

| | | | | |
|---|---|---|---|---|
| 5,303,268 A | * | 4/1994 | Tsutsumi et al. ........... | 375/296 |
| 5,365,546 A | * | 11/1994 | Koenck et al. ............. | 375/223 |
| 7,010,057 B2 | * | 3/2006 | Vayrynen et al. ........... | 375/295 |
| 7,010,280 B1 | * | 3/2006 | Wilson ....................... | 455/126 |
| 7,085,544 B2 | * | 8/2006 | Takano et al. .............. | 455/102 |
| 2005/0136854 A1 | * | 6/2005 | Akizuki et al. ............... | 455/91 |
| 2005/0215206 A1 | * | 9/2005 | Granstrom et al. ......... | 455/102 |
| 2005/0266811 A1 | * | 12/2005 | Weiss ...................... | 455/127.1 |
| 2005/0282508 A1 | * | 12/2005 | Huang et al. ............ | 455/127.2 |

* cited by examiner

*Primary Examiner*—Sonny Trinh
(74) *Attorney, Agent, or Firm*—Banner & Witcoff, Ltd.

(57) ABSTRACT

A transmitter 2 comprises a power amplifier 3 and power controller 4. The power amplifier 3 is capable of both linear and non-linear operation, and is controlled by a controller 20 and first and second control loops 21,22. The second control loop 22 is used with the transmission of GMSK modulated signals, which have no amplitude modulation, operating the power amplifier 3 in a non-linear mode. The first control loop 21 is used for the transmission of EDGE modulated signals, which have a substantial amount of amplitude modulation, operating the power amplifier 3 in a linear mode. The first control loop 21 is also used with GMSK time slots if the output power to be produced by the power amplifier 3 is low and the power of an immediately preceding time slot is high. In this case, a sample and hold circuit 9, 10 of the first control loop 21 is used when the power detector voltage in the power amplifier would change over the time slot by cooling, avoiding the possibility of the power level varying over the time slot.

11 Claims, 2 Drawing Sheets

CONTROLLING TRANSMISSION MODE ON BASIS OF POWER IN PRECEDING TIME SLOT

This application claims priority to GB 0412188.5 Filed Jun. 1, 2004.

FIELD OF THE INVENTION

The invention relates to a transmitter, and a method of operating a transmitter. It particularly relates to a transmitter in which data is modulated using one of a first modulation scheme and a second modulation scheme in each of a series of time slots, and to a method comprising transmitting data in a series of time slots, and applying one of a first modulation scheme and a second modulation scheme to data in each time slot.

BACKGROUND OF THE INVENTION

FIG. 1 depicts a communication device 1 arranged to transmit data in a series of time slots, such as is used in TDMA systems. The communication device 1 comprises a transmitter 2 that includes a power amplifier 3 and a power controller 4 arranged to control the power amplifier 3, together with a RX-TX switch 5 and an antenna 6. The power amplifier 3 supplies power to the antenna 7. A controller 20 is operable to control all the other components. The RX-TX switch 5 connects the antenna 6 to either a receiver (not shown) or the transmitter 2.

Recently, communication devices that are capable of transmitting data using more than one modulation scheme have become available. For example, the Nokia (RTM) 9500 Communicator is arranged to send data using EDGE and using GMSK (Gaussian Minimum Shift Keying) modulation. FIG. 2 depicts part of a prior amplifier arrangement 2 suitable for use in such a communication device. FIG. 2 shows a multimode power amplifier 3 and components of the power controller 4.

When modulated signals with a high degree of amplitude modulation, such as EDGE signals, are to be transmitted, the power amplifier 3 is operated in a linear mode. The power amplifier 3 is controlled using a first control loop 21, comprising a differential amplifier 7a, having a feedback loop including a capacitor 8a, and a sample and hold circuit comprising a capacitor 9 and differential amplifier 10. The first control loop 21 controls the output power of the power amplifier 3 by altering an input signal fed to the power amplifier 3, by adjusting the gain of a variable gain amplifier 11 preceding the power amplifier 3. The power amplifier 3 and the variable gain amplifier 11 cooperate to constitute together a power amplifier.

A switch 12 between the amplifier 7a and the amplifier 10 is closed during the beginning and end of a time slot used for linear transmission, to allow the output power of the power amplifier to be ramped up or down under the control of an input ramp signal TXC. During the intervening portion of the time slot, which is used for data transmission, the switch 12 is open, thereby disconnecting the differential amplifier 7a and its feedback loop. The variable gain amplifier 11 is then controlled by an output of the sample and hold circuit 9, 10, which applies a constant control voltage to the variable gain amplifier.

At the end of a time slot, the transmitter 2 is ramped down. The power controller 4 can then switch between the two control loops 21,22 by means of switches 13a, 13b, 13c, before the transmitter 2 is ramped up at the beginning of the next time slot. The ramping is performed using a ramp signal TXC that is input to the relevant control loop in order to control the output power of the power amplifier 3.

For modulated signals with little or no amplitude modulation, such as GMSK modulated signals, the power amplifier 3 is operated in a non-linear mode in order to improve its power efficiency. When the transmitter 2 is provided in a communication device 1 such as a mobile telephone, this increased efficiency may result in longer talktime. A second control loop 22 is provided, which comprises a differential amplifier 7b and a feedback loop including a capacitor 8b but does not include a sample and hold circuit. The second control loop 22 controls the power amplifier 3 by altering a voltage applied to a power control pin Vpctrl.

At the start and end of a time slot in which GMSK or similar modulated signals are to be transmitted, the output power of the power amplifier 3 is ramped up or down under the control of the input ramp signal TXC. The second control loop remains closed during the beginning, the intervening portion and end of the time slot. This means that, unlike the first control loop 21, the second control loop 22 remains connected to a diode power detector 14 that forms part of and monitors the output power of the power amplifier 3, and adjusts the control voltage accordingly throughout the time slot.

During a time slot in which the output power of the power amplifier 3 used for data transmission is high, the temperature of the components of the power amplifier 3 increases. Heat from the components is transferred to the power detector 14 and may result in a decrease in the accuracy of its measurements. The resulting measurement error may be of the order of 2 mV per degree centigrade, which may result in measurement results that are erroneously low.

If, then, during the next time slot, the power amplifier 3 is to be operated in a non-linear mode to provide an output power that is substantially lower than in the preceding time slot, the components of the power amplifier 3 and the power detector 14 will then cool down during this time slot. This temperature drift causes a drift on the power detector voltage during the time slot and results in the control voltage and, therefore, the output power of the power amplifier 3, decreasing during the intervening portion of the time slot. This is undesirable.

FIG. 3 is a graph showing the output of the power detector 14 during two successive time slots $t_1$, $t_2$. In the first time slot, the output power is high and is above the upper limit of the y-axis of the graph. During the second time slot, the temperature of the power detector 14 is high, due to heat generated by the components of the power amplifier 3 during the first time slot $t_1$, and so the output of the power detector 14 starts at a relatively low value, compared with the actual output power of the power amplifier 3. The output of the power detector 14 then drifts upwards during the second time slot $t_2$ as its diode cools down.

For GSM900, the output power in any given time slot must fall within a range of 5 to 33 dBm, with an accuracy of +/−1 dB during the useful part of a burst. The temperature drift between time slots is most significant when the output power is 33 dBm during a first time slot and 5 dBm during the succeeding time slot. FIG. 4 is a graph of the output power over two GSM 1900 time slots, also labelled $t_1$, $t_2$, and clearly shows a downwards drift in the level of the output power during the second time slot $t_2$.

In some prior amplifier arrangements, this problem has been addressed by providing temperature compensation means for the power detector 14. However, this requires the provision of extra components. Furthermore, the provision of temperature compensation means that are capable of responding to very rapid temperature changes is not straightforward. The power detector 14 may also be located away from the power amplifier 3, for example, as in the arrangement disclosed in U.S. Pat. No. 6,369,635, so that it is not significantly affected by heat from the power amplifier components. However, this requires the provision of external components and may increase the size of the amplifier arrangement 2.

SUMMARY OF THE INVENTION

According to a first aspect of the invention, there is provided a transmitter arranged to transmit data modulated using one of a first modulation scheme and a second modulation scheme in each of a series of time slots, the transmitter comprising:
  a power amplifier operable in linear and non-linear modes;
  power control means, arranged to control the power supplied by the power amplifier; and
  a controller arranged to control the power amplifier to operate in the linear mode in time slots when the first modulation scheme is applied, and to operate in the non-linear mode in time slots when the second modulation scheme is applied,
  the controller being arranged, in respect of a time slot in which the second modulation scheme is used, to determine whether a transmission power in the time slot is lower than the transmission power in an immediately preceding time slot, and in response to a positive determination to control the power amplifier to operate in the linear mode during the time slot.

This can allow the effects of a power detector which is temperature sensitive to be ameliorated.

Typically, the amplifier will be operable in a linear mode when the first modulation scheme has a significant amplitude modulation content, as is found for example with the modulation used with EDGE transmissions. A non-linear mode, which is more efficient, typically is used where the second modulation scheme has a generally constant amplitude, for example the modulation used with GMSK.

Preferably the transmitter includes a sample and hold circuit operable to maintain the gain of the power amplifier at a generally constant value between ramp up and ramp down portions of a time slot when operating in a linear mode.

This sample and hold circuit is a particularly effective way to prevent output power changing over a time slot. Using the sample and hold circuit in the linear mode and operating the power amplifier in the linear mode when the non-linear mode would normally be used, but because the transmission power in the time slot and in the immediately preceding time slot would otherwise result in the power varying over the time slot, has two consequences. Firstly, it prevents the power varying over that time slot. Also though, since amplifiers operating in linear modes conventionally are less efficient, a result is that the power amplification is less efficient, so more power is used for the same output power. The applicant considers that this is an acceptable disadvantage in light of the positive effects of this, namely obtaining a non-varying output power over the time slot.

The advantages of the invention are particularly experienced if the power amplifier comprises first and second amplifier stages, an output of one amplifier stage being coupled to an input of the other stage, in which in the non-linear mode the first amplifier stage is controlled to have a fixed gain and the second amplifier stage is controlled to have a gain dependent on a second amplifier stage control signal generated by a first control loop, and in which in the linear mode the second amplifier stage is controlled to have a fixed gain and the first amplifier stage is controlled to have a gain dependent on a first amplifier stage control signal generated by a second control loop Here, if the second control loop includes a sample and hold circuit operable to maintain the first amplifier stage control signal at a generally constant value between ramp up and ramp down portions of a time slot, this can be used to advantage both when transmitting data modulated with the first modulating scheme and when transmitting data in a time slot when power variation might be expected if the amplifier were operated in a non-linear mode.

If the transmitter comprises a power detector integrated with the power amplifier, it does not need to be provided with quickly acting temperature compensation means. Use of an integrated power detector is preferred since such devices are smaller, and also usually less expensive, than corresponding external arrangements.

According to a second aspect of the invention, there is provided a method of operating a transmitter, the method comprising:
  transmitting data in a series of time slots,
  applying one of a first modulation scheme and a second modulation scheme to data in each time slot; and
  controlling a power amplifier to operate in a linear mode in time slots when the first modulation scheme is applied, and to operate in a non-linear mode in time slots when the second modulation scheme is applied,
  the method further comprising, in respect of a time slot in which the second modulation scheme is used, determining whether a transmission power in the time slot is lower than a transmission power in an immediately preceding time slot, and in response to a positive determination controlling the power amplifier to operate in the linear mode during the time slot.

BRIEF DESCRIPTION OF THE DRAWINGS

An embodiment of the invention will now be described with reference to the accompanying drawings, in which.

DETAILED DESCRIPTION OF THE PREFERRED EMBODIMENTS

Figure 1:
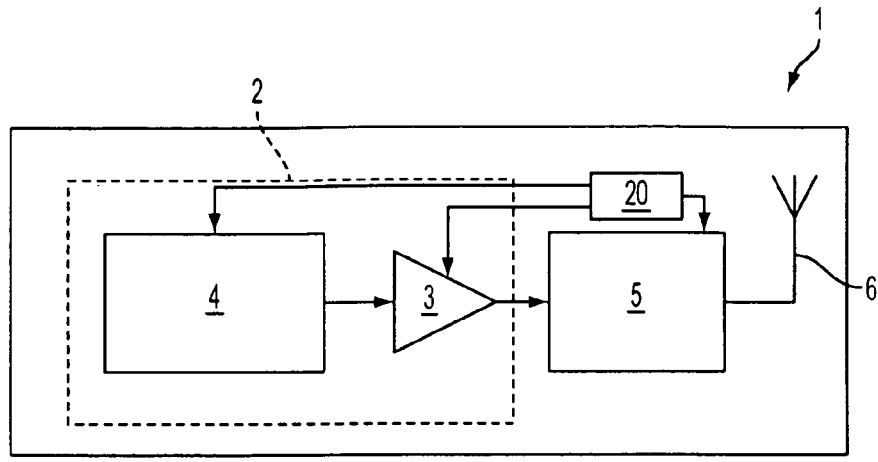
FIG. 1 depicts a transmitter that may be operated according to the present invention.
Figure 2:
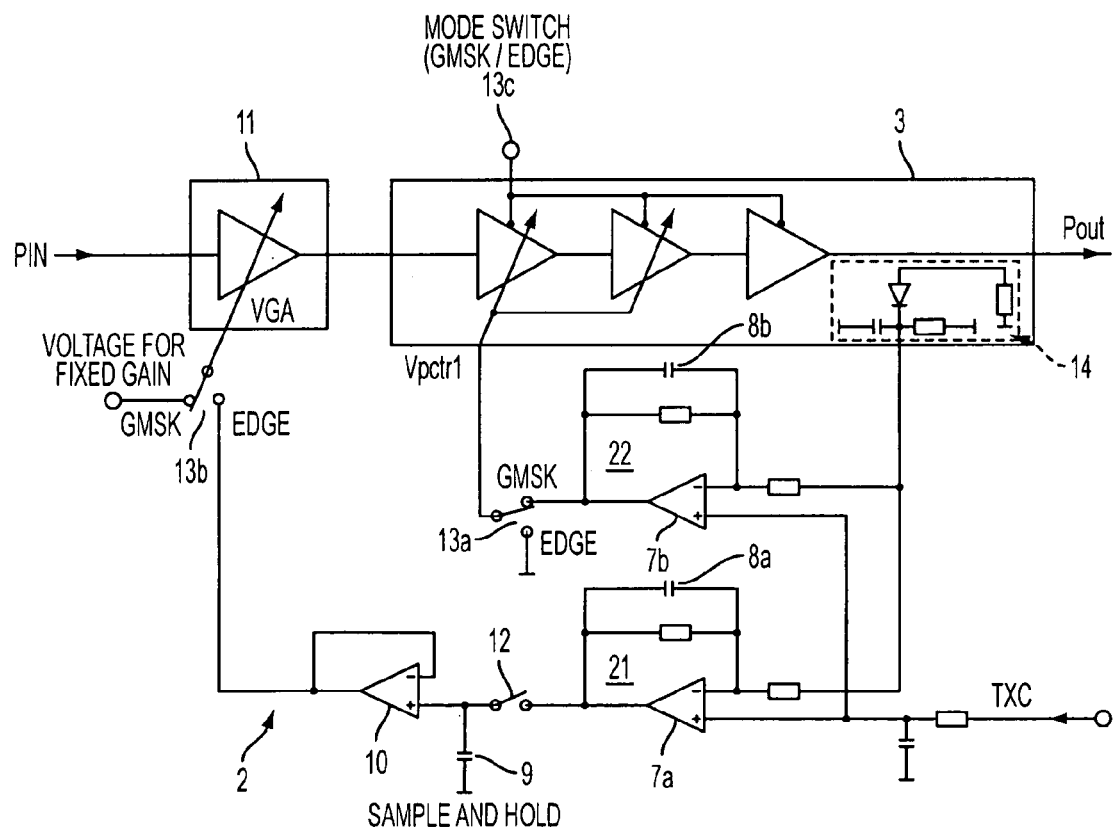
FIG. 2 depicts an amplifier arrangement forming part of the FIG. 1 transmitter.
Figure 3:
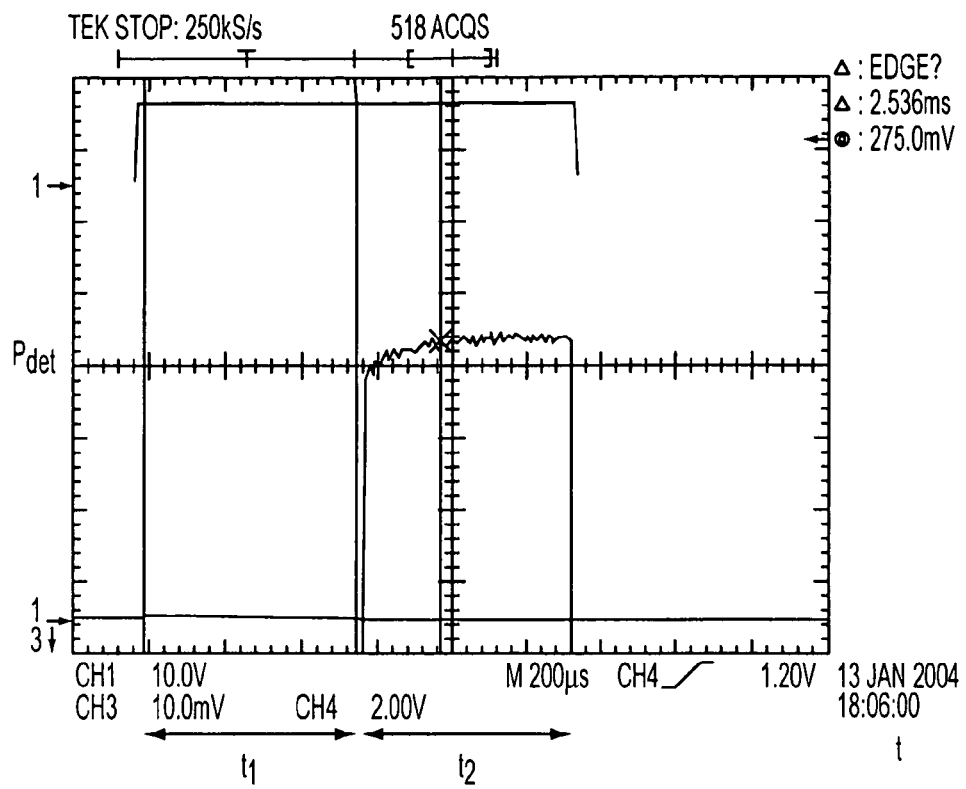
FIG. 3 is a graph showing the output power over two successive time slots.
Figure 4:
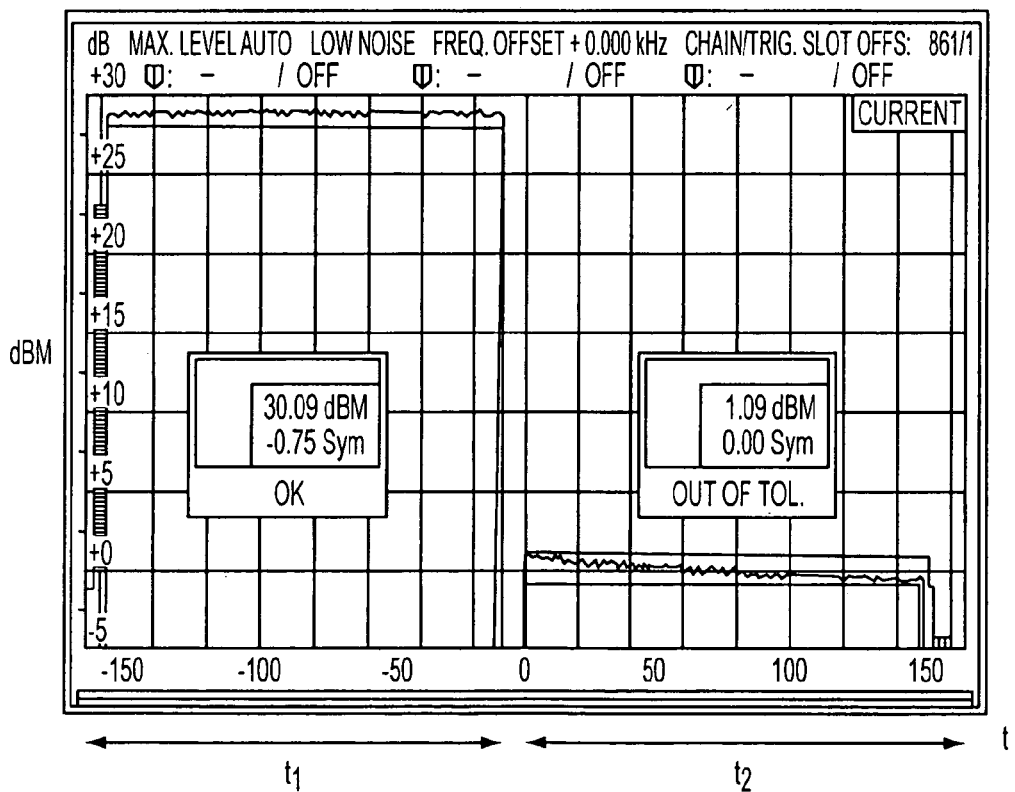
FIG. 4 is a graph showing an output of a power detector over two successive time slots.

In an embodiment of the invention, a transmitter 2 comprises a power amplifier 3 and power controller 4, as shown in FIGS. 1 and 2. The power amplifier 3 is capable of both linear and non-linear operation, and is controlled by a controller 20 and first and second control loops 21, 22 as described above in relation to the prior art.

However, instead of using the first control loop 21 exclusively for time slots in which data signals with a high degree of amplitude modulation are to be transmitted, the first control loop 21 is also used when non-amplitude modulated signals are transmitted if the output power to be produced by the power amplifier 3 is low and in the immediately preceding time slot a high output power was produced.

For example, the communications device 1 may be a mobile transmitter arranged to transmit data using EDGE and GMSK modulation schemes. It may alternatively be a mobile, or cellular, telephone, or any other transmitter device. The power controller 4 is arranged to use the second control loop 22 for the transmission of GMSK modulated signals at a high power, operating the power amplifier 3 in a non-linear mode for efficiency reasons. The first control loop 21 is used for the transmission of EDGE modulated signals and also for GMSK modulated signals in certain circumstances.

When the first control loop 21 is used, the switch 12 is open during the central portion of a time slot during which data is transmitted as described above, and the power amplifier 3 is controlled using the sample and hold circuit 9, 10. As the power detector 14 is disconnected from the variable gain amplifier 11 by the sample and hold circuit 9, 10, its output has no effect on the control signal applied to the variable gain amplifier 11. Therefore, any change in the temperature of the power detector 14 does not affect the control and, therefore, the output power of the power amplifier 3.

When data is to be transmitted in a GMSK time slot, the controller 20 determines whether to operate the power amplifier 3 in a linear or non-linear mode. Normally, the non-linear mode will be selected by the controller 20. When the output power, though, is low and the output power in an immediately preceding time slot was high, the controller 20 controls the power controller 4 to use the first control loop 21 and controls the power amplifier 3 to operate in linear mode.

The efficiency of the power amplifier 3 when operated in linear mode, using the first control loop 21, is lower than when operated in non-linear mode, using the second control loop 22. However, the loss in efficiency is offset by the removal of the drift in the output power caused by temperature changes in the power detector 14.

The power controller 4 may be arranged so that the power amplifier 3 is operated in linear mode during a time slot in which non-amplitude modulated signals are to be transmitted at any power level that is lower than an output power used during an immediately preceding time slot. Alternatively, the power controller 4 may determine whether the output power to be provided during a time slot is "low" using a predetermined power threshold. For example, the threshold may be defined in terms of a power level, or alternatively as a predetermined fraction of the maximum output power that can be provided by the power amplifier 3.

Because of the power inefficiencies associated with operating the power amplifier 3 in linear mode, advantageously the linear mode is used for GMSK time slots only when beneficial. Since there is only significant cooling of the power detector 14 over the duration of a time slot when the output power in the time slot is low and the output power in the preceding timeslot is high, the linear mode preferably is used only in such circumstances. The exact scheme for determining whether the power is high or low may be implementation dependent. In particular, the extent of heating and cooling of the power detector 14 may depend on certain component choices. It is preferred that the linear mode is used for GMSK time slots only when the power is significantly lower than in the immediately preceding time slot. This may be determined by comparing the ratios of the output power between the time slots to a predetermined threshold, or in any other suitable way.

The invention may be implemented in Digital Signal Processing software configured to control the transmitter 2.

While the embodiments have been described above in relation to a communication device, such as a mobile telephone, an amplifier arrangement according to the present invention may be used in any data transmitting device, portable or fixed, including base station transmitters, and is particularly suitable for mixed mode data transmission devices.

In addition, the invention is not limited to amplifier arrangements comprising the control loops shown in FIG. 2. In particular, it is not essential for the power detector 14 to be located within the power amplifier 3.

What is claimed is:

1. A transmitter arranged to transmit data modulated using one of a first modulation scheme and a second modulation scheme in each of a series of time slots, the transmitter comprising:

a power amplifier operable in linear and non-linear modes;

power control means, arranged to control the power supplied by the power amplifier; and a controller arranged to control the power amplifier to operate in the linear mode in time slots when the first modulation scheme is applied, and to operate in the non-linear mode in time slots when the second modulation scheme is applied, the controller being arranged, in respect of a time slot in which the second modulation scheme is used, to determine whether a transmission power in the time slot is lower than the transmission power in an immediately preceding time slot, and in response to a positive determination to control the power amplifier to operate in the linear mode during the time slot.

2. A transmitter according to claim 1, including a sample and hold circuit operable to maintain the gain of the power amplifier at a generally constant value between ramp up and ramp down portions of a time slot when operating in a linear mode.

3. A transmitter according to claim 1, comprising a power detector integrated with the power amplifier.

4. A communication device including a transmitter as claimed in claim 1.

5. A radiotelephone including a transmitter as claimed in claim 1.

6. A transmitter arranged to transmit data modulated using one of a first modulation scheme and a second modulation scheme in each of a series of time slots, the transmitter comprising:

a power amplifier operable in linear and non-linear modes, the power amplifier comprising first and second amplifier stages connected in series;

power control means, arranged to control the power supplied by the power amplifier, the power control means including first and second control loops; and a controller arranged to control the power amplifier to operate in the linear mode in time slots when the first modulation scheme is applied, and to operate in the non-linear mode in time slots when the second modulation scheme is applied, wherein the controller is arranged, in respect of a first time slot in which the second modulation scheme is used, to determine whether a transmission power in the first time slot is lower than the transmission power in a second time slot, the second time slot immediately preceding the first time slot, and in response to a positive result to the determination to control the power amplifier to operate in the linear mode during the first time slot, in which in the non-linear mode the first amplifier stage is controlled to have a fixed gain and the second amplifier stage is controlled to have a gain dependent on a second amplifier stage control signal generated by the first control loop, and in which in the linear mode the second amplifier stage is controlled to have a fixed gain and the first amplifier stage is controlled to have a gain dependent on a first amplifier stage control signal generated by the second control loop.

7. A transmitter according to claim 6, in which the second control loop includes a sample and hold circuit operable to maintain the first amplifier stage control signal at a generally constant value between ramp up and ramp down portions of a time slot.

8. A transmitter according to claim 6, comprising a power detector integrated with the power amplifier.

9. A communication device including a transmitter as claimed in claim 6.

10. A radiotelephone including a transmitter as claimed in claim 6.

11. A method of operating a transmitter, the method comprising:

transmitting data in a series of time slots, applying one of a first modulation scheme and a second modulation scheme to data in each time slot; and controlling a power amplifier to operate in a linear mode in time slots when the first modulation scheme is applied, and to operate in a non-linear mode in time slots when the second modulation scheme is applied, the method further comprising, in respect of a time slot in which the second modulation scheme is used:

determining whether a transmission power in the time slot is lower than a transmission power in an immediately preceding time slot, and in response to a positive result to the determination, controlling the power amplifier to operate in the linear mode during the time slot.

* * * * *